United States Patent
Tsai

[19]

[11] Patent Number: 5,880,033
[45] Date of Patent: *Mar. 9, 1999

[54] METHOD FOR ETCHING METAL SILICIDE WITH HIGH SELECTIVITY TO POLYSILICON

[75] Inventor: Hui-Ing Tsai, San Jose, Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 664,576

[22] Filed: Jun. 17, 1996

[51] Int. Cl.⁶ .................................................. H01L 21/00
[52] U.S. Cl. .......................... 438/710; 438/714; 438/719; 438/721; 216/67; 216/72
[58] Field of Search .................................... 438/710, 714, 438/719, 721; 216/67, 72

[56] References Cited

U.S. PATENT DOCUMENTS

| | | | |
|---|---|---|---|
| 4,411,734 | 10/1983 | Maa | 156/643 |
| 4,460,435 | 7/1984 | Maa | 156/643 |
| 4,465,532 | 8/1984 | Fukano | 156/643 |
| 4,490,209 | 12/1984 | Hartman | 156/643 |
| 4,878,994 | 11/1989 | Jucha et al. | 156/643 |
| 5,094,712 | 3/1992 | Becker et al. | 156/643 |
| 5,160,407 | 11/1992 | Latchford et al. | 156/656 |
| 5,188,980 | 2/1993 | Lai | 437/193 |
| 5,192,702 | 3/1993 | Tseng | 437/47 |
| 5,211,804 | 5/1993 | Kobayashi et al. | 156/665 |
| 5,256,245 | 10/1993 | Keller et al. | 156/643 |
| 5,310,453 | 5/1994 | Fukasawa et al. | 156/643 |
| 5,338,398 | 8/1994 | Szwejowski et al. | 156/655 |
| 5,346,578 | 9/1994 | Benzing et al. | 156/345 |
| 5,408,130 | 4/1995 | Woo et al. | 257/758 |
| 5,431,772 | 7/1995 | Babie et al. | 156/643.1 |
| 5,437,765 | 8/1995 | Loewenstein | 216/51 |
| 5,468,296 | 11/1995 | Patrick et al. | 118/723 MP |
| 5,487,811 | 1/1996 | Iizuka | 156/656.1 |
| 5,488,246 | 1/1996 | Hayashide et al. | 257/336 |
| 5,505,322 | 4/1996 | Shinohara et al. | 216/78 |
| 5,529,197 | 6/1996 | Grewal | 216/68 |
| 5,540,800 | 7/1996 | Qian | 156/345 |
| 5,558,722 | 9/1996 | Okumura et al. | 118/723 I |
| 5,591,301 | 1/1997 | Grewal | 156/643.1 |
| 5,660,681 | 8/1997 | Fukuda et al. | 438/695 |

FOREIGN PATENT DOCUMENTS

| | | |
|---|---|---|
| 0516043 | 12/1992 | European Pat. Off. . |
| 2285336 | 7/1995 | United Kingdom . |

OTHER PUBLICATIONS

Maruyama, et al., "Mechanism of $WSi_2$ Etching Using ECR Plasma," *1993 Dry Process Symposium* pp. 55–60.

Parks, et al., "Plasma Etching of Tungsten Polycide Structures Using $NF_3$–Mixed Halocarbon Etchants," *J. Electrochem. Soc.*, vol. 138(9):2736–2740, Sep. 1991.

*Primary Examiner*—Mark Chapman
*Attorney, Agent, or Firm*—Janah & Associates

[57] ABSTRACT

A method for etching metal silicide layers 22a, 22b and polysilicon layers 24a, 24b on a substrate 20 with high etching selectivity, and anisotropic etching properties, is described. In the method, the substrate 20 is placed in a plasma zone 55, and process gas comprising $Cl_2$, $O_2$, and $N_2$, is introduced into the plasma zone. A plasma is formed from the process gas to selectively etch the metal silicide layer 22 at a first etch rate that is higher than a second rate of etching of the polysilicon layer 24, while providing substantially anisotropic etching of the metal silicide and polysilicon layers. Preferably, the plasma is formed using combined inductive and capacitive plasma sources.

28 Claims, 4 Drawing Sheets

METHOD FOR ETCHING METAL SILICIDE WITH HIGH SELECTIVITY TO POLYSILICON

CROSS-REFERENCE TO RELATED APPLICATION

This application is related to U.S. patent application Ser. No. 08/665,657, entitled "METHOD FOR ETCHING POLYCIDE STRUCTURES," to Pan et al., filed Jun. 17, 1996, which is incorporated herein by reference.

BACKGROUND

The present invention relates to a method for etching metal silicide layers during processing of semiconductor substrates.

Figure 1A:
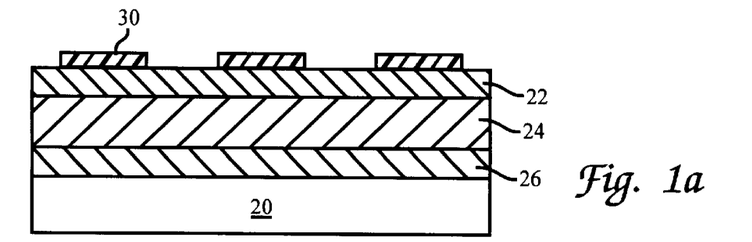
FIG. 1a is a schematic in vertical cross-section of a polycide stack comprising a metal silicide layer deposited over a polysilicon layer on a semiconductor substrate.

In integrated circuit fabrication, refractory metal silicides, such as for example tungsten, tantalum, titanium, and molybdenum silicides, are used to form high density, high speed, highly electrically conductive interconnect features and lines for electrically connecting devices formed on semiconductor substrates. For example, $WSi_x$ layers can be deposited on silicon dioxide to serve as gate electrodes for integrated circuits. However, at the silicide and oxide interface, diffusion of silicon from the $SiO_2$ layer into the refractory metal silicide layer causes the metal silicide layer to have unacceptably high electrical resistance. "Polycide" stacks were developed to reduce the diffusion problems with metal silicide layers. With reference to FIG. 1a, typical polycide structures on a semiconductor substrate 20 comprise refractory metal silicide layers 22a, 22b deposited over doped or undoped polysilicon layers 24a, 24b. The polycide structures are formed over silicon dioxide layers 26a, 26b on the substrate 20, and provide a low electrical resistance interconnect with excellent interfacial characteristics.

Figure 1B:
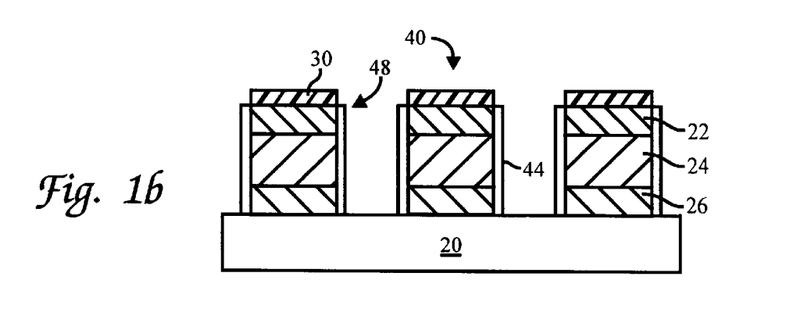
FIG. 1b is a schematic in vertical cross-section of the substrate of FIG. 1a after etching of the metal silicide and polysilicon layers showing substantially anisotropically etched features.
Figure 1C:
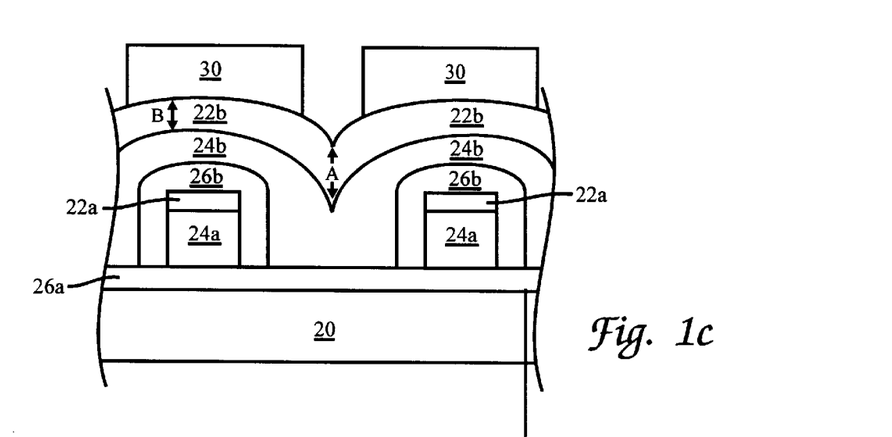
FIG. 1c is a schematic in vertical cross-section of a non-planar and highly convoluted topography of a metal silicide layer deposited over a polysilicon layer on a substrate.
Figure 1D:
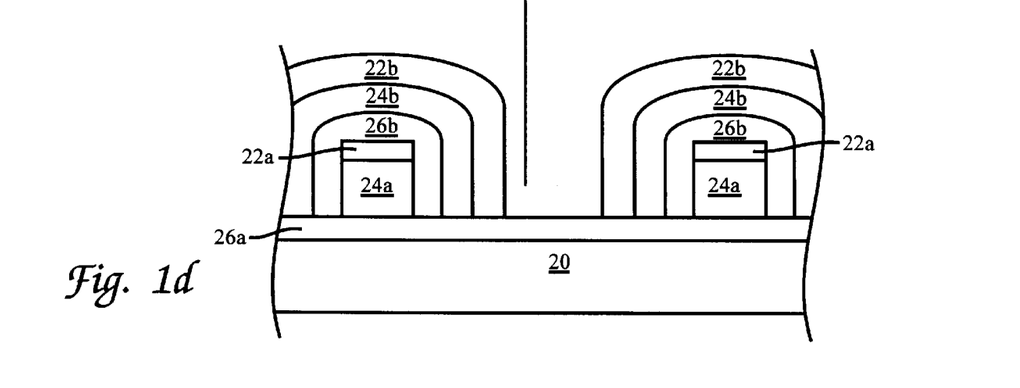
FIG. 1d is a schematic in vertical cross-section of the substrate of FIG. 1c after etching of the metal silicide and polysilicon layers showing substantially anisotropically etched features.

In conventional methods of fabricating the polycide interconnect structures, the metal silicide layers 22 are deposited over polysilicon layers 24. For example, commonly assigned U.S. Pat. No. 5,500,249, to Telford et al., incorporated herein by reference, describes a chemical vapor deposition process for depositing $WSi_x$ films on polysilicon via plasma enhanced chemical vapor deposition of tungsten hexafluoride and dichlorosilane. After deposition of the metal silicide layer 22, photoresist material is applied on the polycide layers and exposed to light to form a desired pattern of interconnect features using conventional photolithographic processes. The patterned resist 30 serves as a mask for etching of the polycide structure using conventional etching processes to provide the shape of the etched feature 40 illustrated in FIG. 1b. Thereafter, the deposition and etching process can be repeated to form additional layers of polycide stacks, as illustrated in FIGS. 1c and 1d.

Conventional etching processes use a microwave or capacitive plasma of halogen-containing gases to etch the polycide stack. Commonly used fluorinated etchant gases include $CF_4$, $SF_6$, and $NF_3$; chlorine-containing etchant gases include $Cl_2$ and $BCl_3$; and bromine-containing etchant gases include HBr. One problem with conventional etching processes is their relative inability to provide high etching selectivity ratios for etching metal silicide with respect to polysilicon, while simultaneously forming anisotropically etched feature profiles.

The etching selectivity ratio is the ratio of the rate of etching of the metal silicide layer 22 to the rate of etching of the underlying polysilicon layer 24. It is particularly desirable have high etching selectivity ratios for polycide structures having a non-planar and highly convoluted topography, as schematically illustrated in FIG. 1c. In these structures, the portion of the conformal metal silicide layer 22b between the etched features as shown by the arrow A, is thicker than the portion of the metal silicide layer 22b on top of the etched features as shown by the arrow B. Thus, at a certain time during the etching process, at the portion B the metal silicide layer is etched through and etching of the underlying polysilicon layer begins, while at the portion A, the thicker metal silicide layer 22 is still being etched. This effect requires that the polysilicon layer 24b at the portion B be etched sufficiently slowly relative to the rate of etching of the silicide layer, that the entire polysilicon layer 24b at portion B is not etched through, before completion of etching of the thicker portions of the convoluted metal silicide layer 22b at portion A. Thus, it is desirable to etch the metal silicide layer 22 at a faster rate relative to the rate of etching of the polysilicon layer 24.

High etching selectivity ratios are obtained by using process gas compositions that etch different materials at different etching rates, depending upon the chemical reactivity of the process gas with the different materials. However, etching metal silicide with high selectivity to polysilicon is particularly difficult, because both materials contain elemental silicon and most conventional etchant plasmas etch the silicon portion to form gaseous $SiCl_x$ or $SiF_x$ species. Thus, it is difficult for the etchant plasma to chemically distinguish and preferentially etch the metal silicide layer 22 faster than the polysilicon layer 24. Also, the more chemically-active plasma etching processes, such as ECR and/or microwave plasma processes, provide more dissociated chemically active etchant species, and result in isotropic etching of the silicide layers, as described below.

It is also desirable to etch the polycide stack to form anisotropically etched features 40, which result when the metal silicide and polysilicon layers are etched substantially vertically to provide features having straight sidewalls 48. Excessive etching at the sidewalls 48 of the etched features results in undesirable inwardly or outwardly sloped walls. A degree of anisotropic etching is obtained when dissociated species in the etchant gas combine to form complex polymeric byproducts that deposit as "passivating" layers on the sidewalls of freshly etched features 40, and serve to limit further etching of the sidewalls 48. More typically, anisotropic etching is obtained by imparting a highly directional kinetic energy to the charged species in the etchant plasma (by subjecting the plasma to an electric field perpendicular to the substrate 20), that causes the plasma species to energetically impinge upon and remove substrate material in the vertical etching direction. However, different materials are sputter etched by the highly energized plasma at the same etch rate providing little or no control over etching selectivity. For these reasons, it is difficult to obtain anisotropic etching in combination with high etching selectivity ratios for etching metal silicide on polysilicon.

Thus, it is desirable to have an etching process for etching polycide structures with high etching selectivity, and in particular, for etching metal silicide layers at faster etch rates than polysilicon. It is further desirable for the etching process to provide substantially anisotropic etching, and to provide uniform etching rates across the surface of the substrate.

SUMMARY

The present invention is directed to a method of etching polycide structures comprising metal silicide and polysilicon layers, substantially anisotropically, and with high etching selectivity. In the method, a substrate is placed in a plasma zone, and process gas comprising $Cl_2$, $O_2$, and $N_2$, is introduced into the plasma zone. A plasma is formed from the process gas to selectively etch the metal silicide layer at a first etch rate that is higher than a second rate of etching of the polysilicon layer, while providing substantially anisotropic etching of the metal silicide and polysilicon layers.

Preferably, the etchant plasma is formed using combined inductive and capacitive plasma sources, for example, in a process chamber comprising an inductor coil and process electrodes. A process gas comprising $Cl_2$, $O_2$, and $N_2$ is ionized in the chamber to form plasma ions that energetically impinge on the substrate by (i) applying an RF current at a first power level to the inductor coil, and (ii) applying an RF voltage at a second power level to the process electrodes. A power ratio $P_r$ of the first power level to the second power level is selected to provide highly selectivity etching of the metal silicide layer relative to the polysilicon layer, while providing substantially anisotropic etching of both layers.

Preferably, the gas composition and power ratio $P_r$ of the plasma are selected so that the etch rate of the metal silicide layer is at least 1.2 times the etch rate of the polysilicon layer, and the metal silicide and polysilicon layers are etched to form features that have sidewalls that form angles of at least about 88° with a surface of the substrate. Preferably, the volumetric flow ratio of $O_2:N_2$ is from about 0.25 to about 5:1; and the ratio of the volumetric flow of $Cl_2$ to the combined volumetric flow of $O_2$ and $N_2$ is from about 5:1 to about 20:1. More preferably, the power ratio $P_r$ of the first power level to the second power level is from about 0.1:1 to about 100:1.

DRAWINGS

These and other features, aspects, and advantages of the present invention will become better understood from the following drawings and description, which show and describe examples of the invention, and from the appended claims, where:

DESCRIPTION

The etching process of the present invention is useful for etching a substrate 20 having polycide stacks comprising metal silicide layers 22a, 22b on underlying polysilicon layers 24a, 24b, as shown in FIGS. 1a–1d, with high etching selectivity, good etch rates, and anisotropic etching. The substrate 20 can be made of any material, such as glass, ceramic, metal, polymer, or semiconductor substrate, such as a silicon or gallium arsenide wafers. The metal silicide layer 22 on the substrate 20 typically comprises, for example, tungsten, tantalum, titanium, or molybdenum silicides, having a thickness of about 500 Å to about 10000 Å. The polysilicon layer 24 below the metal silicide layer 22 also typically comprises a thickness of about 500 Å to about 10000 Å. The polycide stack is deposited on a silicon dioxide layer 26 having a thickness of about 1000 Å.

The metal silicide and polysilicon layers 22, 24 are etched to form electrical interconnect lines on the substrate 20. Typically, photoresist 30 such as "RISTON," manufactured by DuPont de Nemours Chemical Company, is applied on the metal silicide layer 22 to a thickness of about 0.4 to about 1.3 micron, and the features 40 to be etched in the metal silicide and polysilicon layers, are defined using conventional lithographic processes in which the resist 30 is exposed to a pattern of light through a mask that corresponds to the desired configuration of features 40. The etched features 40 are typically sized from about 0.2 to about 10 microns, and more typically about 0.4 to 2 microns, and the spacing between the features is typically from 0.2 microns to 10 microns. During the etching process, polymeric passivating deposits 44 form on the sidewalls 48 of the etched features 40, as explained below.

Figure 2:
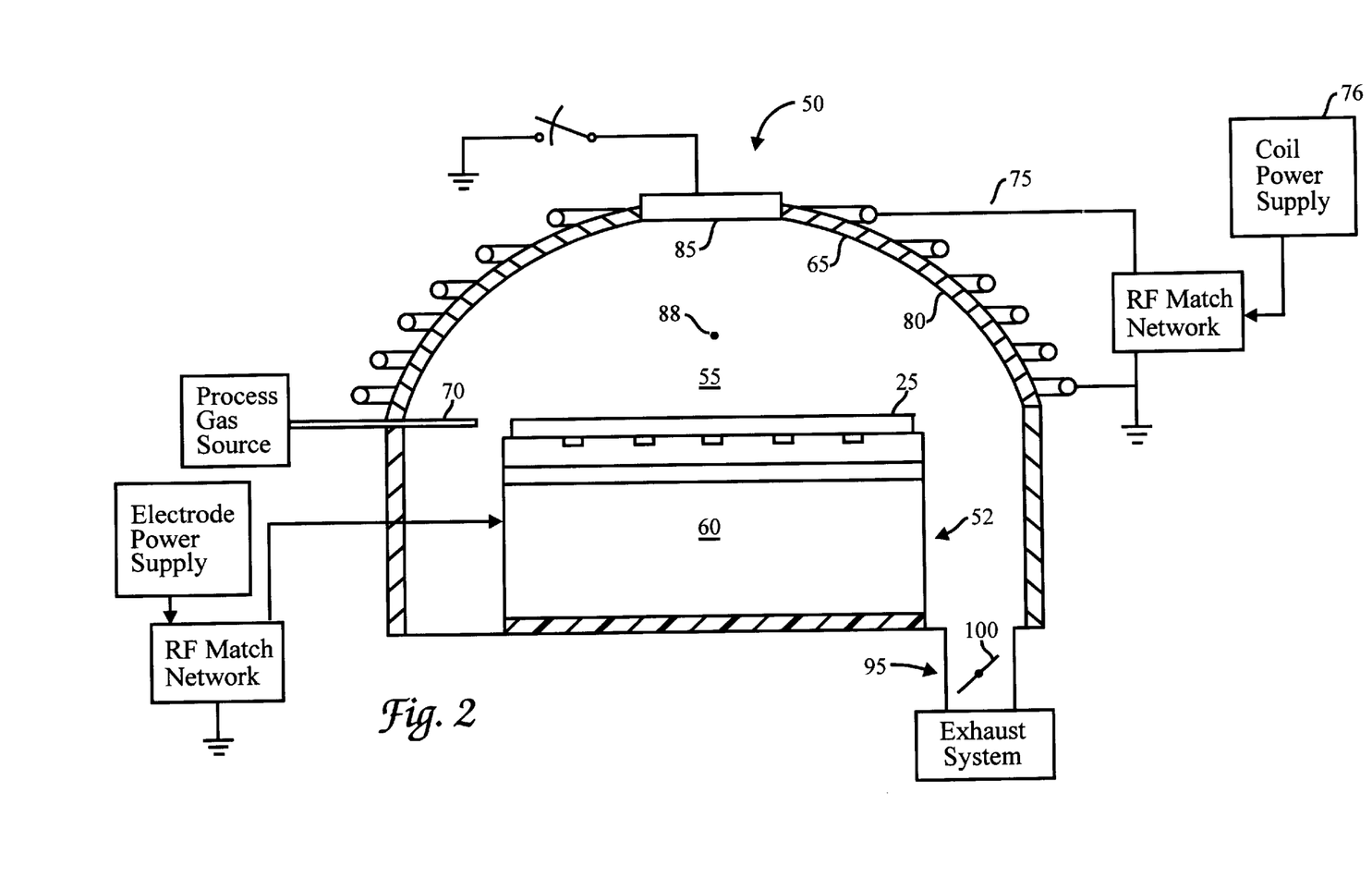
FIG. 2 is a schematic view in vertical cross-section of a process chamber suitable for practicing the etching process of the present invention.

The metal silicide layer 22 and polysilicon layer 24 are etched in a process chamber 50, such as for example, a "DPS" chamber, schematically illustrated in FIG. 2, and commercially available from Applied Materials Inc., Santa Clara, Calif. The process chamber is also described in patent application Ser. No. 08/597,445, entitled "RF Plasma Reactor with Hybrid Conductor and Multi-Radius Dome Ceiling" filed on Feb. 2, 1996; and U.S. patent application Ser. No. 08/389,889, filed on Feb. 15, 1993—both of which are incorporated herein by reference. The particular embodiment of the process chamber 50 shown herein, is suitable for processing of semiconductor substrate 20, is provided only to illustrate the invention, and should not be used to limit the scope of the invention. For example, the etching process of the present invention can be used to etch any substrate, and can be used for manufacturing processes other than semiconductor fabrication.

To perform the process, the chamber 50 is evacuated to a pressure of less than 1 Torr, and a substrate 20 is placed on a support 52 within a plasma zone 55 in the chamber. The substrate 20 can be held in place during the etching process using a mechanical or electrostatic chuck with grooves in which a coolant gas, such as helium, is held to control the temperature of the substrate 20. At least a portion of the support 52 is electrically conductive and serves as a process cathode electrode 60. The cathode electrode 60, in conjunction with sidewalls of the chamber 50 that are electrically grounded to serve as an anode electrode 65, form process electrodes in the plasma zone 55.

Process gas is introduced into the chamber 50 through a gas distributor 70 peripherally disposed about the substrate 20, and the chamber is maintained at a pressure ranging from about 0.1 to about 100 mTorr, and more typically from 2 to 20 mTorr. A plasma is formed from the process gas using a plasma generator that couples an electric field into the plasma zone 55. The plasma generator can comprise an inductor coil 75 adjacent to the process chamber 50, and capable of forming an inductive electric field in the chamber when powered by a coil power supply 76. Preferably, an RF current at a first power level is applied to the inductor coil 75, the first power level being preferably from about 200 Watts to about 2000 Watts.

In addition to the inductor coil, the cathode and anode electrodes 60, 65, powered by an electrode power supply 78 are used to generate a capacitive electric field in the process chamber 50. Typically an RF voltage at a second power level of from about 100 to about 2000 Watts is applied to the cathode electrode 60, and the anode electrode 65 is electrically grounded. The capacitive electric field is perpendicular to the plane of the substrate 20, and accelerates inductively formed plasma species toward the substrate 20 to provide more vertically oriented anisotropic etching of the substrate. The frequency of the RF voltage applied to the process electrodes 60, 65, and/or the inductor coil 75 is typically from about 50 Khz to about 60 MHz, and more typically about 13.56 MHz.

It is preferred to use a process chamber 50 having a quasi-remote plasma zone 55 to obtain optimal etching properties. The quasi-remote plasma zone 55 is within the region bounded by (i) the substrate 20, (ii) chamber sidewalls 80 adjacent to the substrate, and (iii) the ceiling 85 of the chamber having an apex at a height H of from about 100 mm to about 175 mm (4 to 7 inches) above the substrate 20. It should be noted that the ceiling height can vary for different sized substrate, the ceiling height described herein being suitable for substrate having diameters of from about 150 mm to about 304 mm (6 to 12 inches). Preferably, the quasi-remote plasma zone 55 comprises a volume of at least about 10,000 cm$^3$, and more preferably from about 10,000 to about 50,000 cm$^3$. In the quasi-remote plasma zone, the plasma is formed directly below the ceiling 85 and immediately above the substrate 20. Preferably, the quasi-remote plasma zone 55 has a center 88 located at a distance of about 50 to about 150 mm directly above the substrate 20, and more preferably at a distance that is greater than about 75 mm and less than about 125 mm from the substrate 20.

It is believed that the quasi-remote plasma zone 55 provides an increased amount of dissociated etchant Cl$^+$ ions relative to non-dissociated Cl$_2^+$ ions, because the plasma is generated in a relatively large volume of space immediately adjacent to the substrate 20. This feature allows the plasma to etch the substrate 20 before a large amount of the dissociated ions Cl$^+$ ions recombine to form non-dissociated Cl$_2^+$ ions. If the center 88 of the plasma zone 55 is remote from the substrate 20, for example, at a distance of greater than about 30 cms, the dissociated plasma ions recombine to form non-dissociated ions while traveling from the remote plasma source to the substrate 20. Conversely, if the center 88 of the plasma zone 55 is too close to the substrate 20, i.e., less than about 10 cms, the high power current applied to the plasma generator to increase dissociation of the plasma ions, causes the plasma ions to have excessively high kinetic energies which results in poor etching performance. Similarly, if the volume of the plasma zone 55 is excessively large, the dissociated ions in the plasma zone recombine to form non-dissociated species. Also, if the volume of the plasma zone 55 is too small, it is difficult to form dissociated plasma ions because the mean free path of the energized inert gas ions is excessively small, resulting in fewer collisions between the inert gas ions and the etchant gas molecules. For these reasons, it is preferred to use the quasi-remote plasma zone 55.

The ceiling 85 of the process chamber 50 can be flat or rectangular shaped, arcuate, conical, dome-shaped, or multi-radius dome-shaped. Preferably, the process chamber 50 has a multi-radius dome-shaped ceiling 85 above the substrate 20 to provide a uniform distribution of plasma source power across the entire volume of the plasma zone 55 to increase dissociation of the etchant gas, as for example described in U.S. patent application Ser. No. 08/596,960, to Diana Ma et al., entitled "PLASMA PROCESS FOR ETCHING MULTICOMPONENT ALLOYS," filed on Feb. 5, 1996, which is incorporated herein by reference. The multi-radius dome-shaped ceiling 85 reduces dissociated ion recombination losses near the substrate 20 to less than those experienced with a flat ceiling, so that plasma ion density is more uniform across the substrate 20. This is because ion recombination losses are affected by the proximity of the ceiling 85, and the dome-shaped ceiling is further from the substrate center than a flat ceiling.

Preferably, the inductor coil 75 is wrapped around the sidewall 80 of the process chamber 50 in the form of a multi-radius dome-shaped inductor coil having a "flattened" dome shape that provides more efficient use of plasma source power and increased plasma ion density directly over the substrate center. This is because ion density is affected by local ionization near the inductor coil 75, and a multi-radius inductor coil is closer to the substrate center than a hemispherical coil. In another preferred embodiment, the ceiling 85 comprising a multi-radius dome having at least a center radius R and a corner radius r less than the center radius R, wherein R/r is from about 2 to about 10.

The plasma formed in the quasi-remote plasma zone 55 can also be enhanced using magnetically enhanced reactors, in which a magnetic field generator, such as a permanent magnet or electromagnetic coils, are used to apply a magnetic field in the plasma zone 55 to increase the density and uniformity of the plasma. Preferably, the magnetic field comprises a rotating magnetic field with the axis of the field rotating parallel to the plane of the substrate 20, as described in U.S. Pat. No. 4,842,683, issued Jun. 27, 1989, which is incorporated herein by reference. The magnetic field in the chamber 50 should be sufficiently strong to increase the density of the ions formed in the plasma, and sufficiently uniform to reduce charge-up damage to features such as CMOS gates. Generally, the magnetic field as measured on a surface of the substrate is less than about 500 Gauss, more typically from about 10 to about 100 Gauss, and most typically from about 10 Gauss to about 30 Gauss.

Spent process gas and etchant byproducts are exhausted from the process chamber 50 through an exhaust system 95 capable of achieving a minimum pressure of about 10$^{-3}$ mTorr in the process chamber 50. A throttle valve 100 is provided in the exhaust for controlling the pressure in the chamber 50. Also, an optical endpoint measurement technique is often used to determine completion of the etching process for a specific layer by measuring the change in light emission of a particular wavelength corresponding to a detectable gaseous species. A sudden decrease or increase in the amount of the detectable species, such as silicon species, that results from chemical reaction of the process gas with the silicon dioxide layer 26, indicates completion of etching of the metal silicide layer 22 and start of etching of the underlying layer.

The etching process of the present invention provides high etch rates, and highly selective etching of metal silicide relative to polysilicon.

The process gas used in the etching process comprises (i) chlorine, (ii) oxygen, and (iii) nitrogen. The chlorine gas forms dissociated atomic chlorine and chlorine-containing species that etch the metal silicide layer 22 and polysilicon layer 24 on the substrate 20. For example, silicon in the metal silicide and polysilicon layers 22, 24 can be etched by chlorine-containing ions and neutrals to form volatile $SiCl_x$ species that are exhausted from the chamber 50. The chlorine gas can comprise $Cl_2$, or can comprise other chlorine-containing gases that are equivalent to chlorine, for example, HCl, $BCl_3$, and mixtures thereof.

The oxygen gas, for example, $O_2$, $O_3$, and other equivalent oxygen-containing gases, is used to enhance the rate of etching of metal silicide layer 22 without increasing the rates of etching of silicon-containing underlayers, such as the polysilicon layer 24. However, excessively high flow rates of the oxygen gas can cause more isotropic etching of the substrate by removing the passivating deposits 44 formed on the etched features, and can also result in excessively low dielectric etch rates. For these reasons, the flow rate of oxygen gas is maintained lower than the flow rate of the chlorine gas to provide sufficient chlorine-containing species to rapidly etch the substrate 20, while providing high silicide to silicon etching selectivity, and anisotropic etching.

The nitrogen gas provides unexpected results in combination with the chlorine and oxygen gases. Increasing the nitrogen gas significantly lowers the rate of etching of polysilicon layer 24, without affecting the rate of etching of the metal silicide layer 22. It is believed that the chlorine, nitrogen, and oxygen gas, react with metal silicides to form volatile byproducts (for example when etching tungsten silicide layers volatile species such as $W_xO_yN_zCl$ or $W_xO_yN_z$ are formed) that serve to increase the rate of etching of the $MSi_x$ layer relative to the rate of etching of the polysilicon layer 24. Because the atomic and molecular constituents of an active plasma are difficult to analyze, the nature or composition of the metal-containing volatile species is difficult to determine with accuracy. It is also believed that the combination of nitrogen and oxygen serve to balance the rate of deposition and removal of the passivating deposits on the etched features of the substrate to provide more anisotropic etching of the substrate 20. The nitrogen gas preferably comprises $N_2$, or other nitrogen-containing gases equivalent to $N_2$, such as $NO_2$ or $N_2O$.

Figure 3:
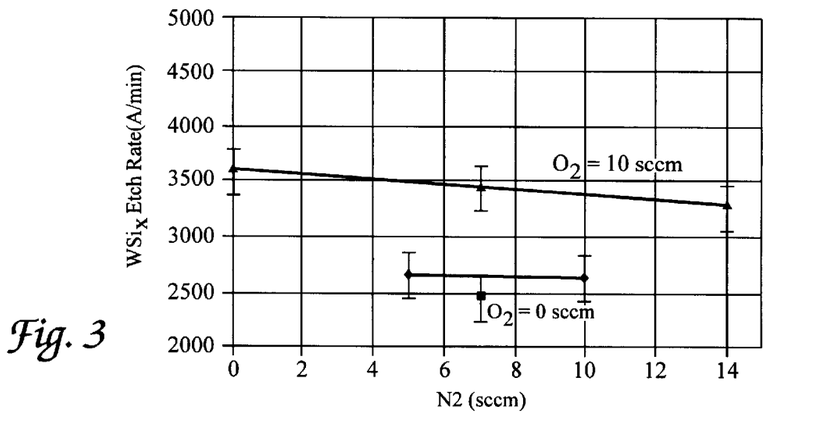
FIG. 3 is a graph showing the $WSi_x$ etch rate for increasing $O_2$ and $N_2$ flow rates.
Figure 4:
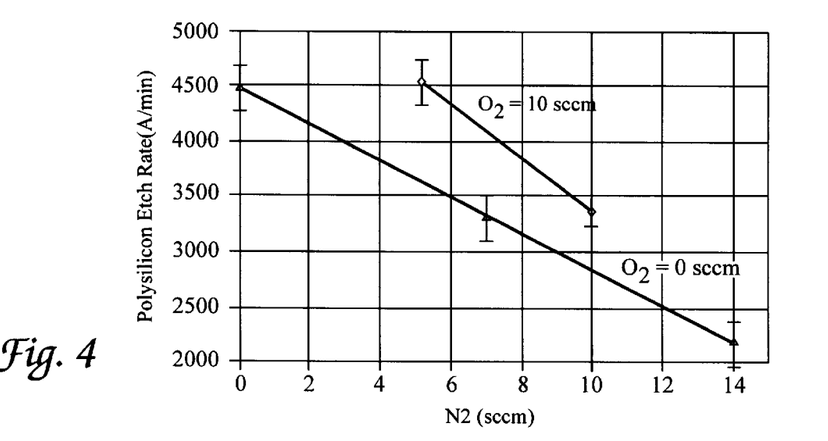
FIG. 4 is a graph showing the polysilicon etching rate for increasing flow rates of $O_2$ and $N_2$.
Figure 5:
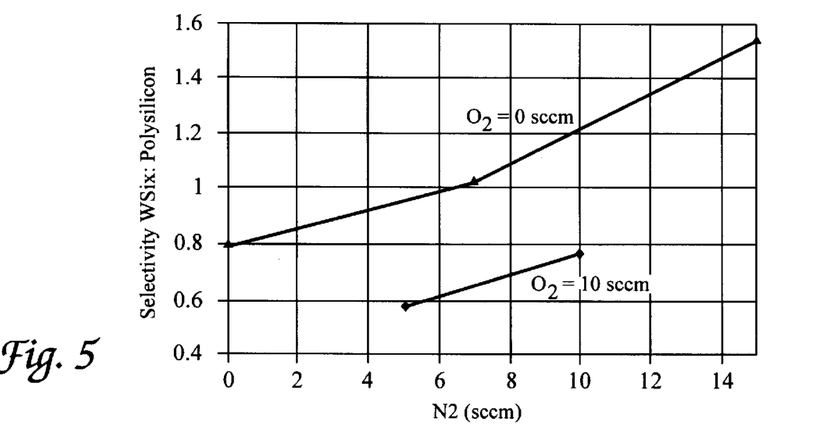
FIG. 5 is graph showing the etching selectivity ratios of etching $WSi_x$ relative to polysilicon for increasing flow rates of $N_2$ and $O_2$ in the process gas.

The unexpected results provided by the $Cl_2$—$O_2$—$N_2$ process gas are demonstrated by FIGS. 3–5 which show the effect of increasing $O_2$ and $N_2$ flow rates on the rate of etching of a metal silicide layer comprising $WSi_x$, and the etch rate of a polysilicon layer. FIG. 3 shows the $WSi_x$ etch rate for increasing $O_2$ and $N_2$ flow rates. It is observed that increasing $N_2$ flow rates has little effect on the $WSi_x$ etch rate. In contrast, increasing $O_2$ flow rates from 0 sccm to 10 sccm increases the $WSi_x$ etch rates from 250 nm/min to 350 nm/min. Thus, addition of $O_2$ and $N_2$ to the $Cl_2$ gas provides the unexpected results of increasing $WSi_x$ etch rates while simultaneously decreasing the polysilicon etch rates, even though both materials contain elemental silicon. This result provides increased etching selectivity rates for etching $WSi_x$ relative to polysilicon while simultaneously providing higher $WSi_x$ etching rates, which is a highly desirable combination.

FIG. 4 shows the polysilicon etching rate for increasing flow rates of $O_2$ and $N_2$. Generally, the polysilicon etch rate is lowered for increasing flow rates of $O_2$ as well as increasing flow rates of $N_2$. Thus, the addition of $O_2$ and $N_2$ to the chlorine gas serves primarily to improve the etching selectivity ratio of etching $WSi_x$ relative to polysilicon by decreasing the rate of etching of polysilicon. FIG. 5 shows the etching selectivity ratios of etching $WSi_x$ relative to polysilicon for increasing flow rates of $N_2$ and $O_2$ in the process gas. It is observed that the etching selectivity ratios increases for both increasing flow rates of $O_2$ and increasing flow rates of $N_2$. Thus, both $O_2$ and $N_2$ contribute to enhanced selectivity etching ratios.

The composition and volumetric flow ratios of different constituents of the process gas are selected to etch the metal silicide layer 22 faster than the polysilicon layer 24, preferably, at an etching selectivity ratio of at least about 1.2, and more preferably at least about 1.5. The volumetric flow ratio of the process gas is also selected to provide anisotropically etched features having sidewalls 48 with smooth surfaces that form angles (α) of at least about 88° with a plane of the substrate 20, and more preferable angles from about 89° to about 90°. Preferred volumetric flow ratios of $O_2:N_2$ are from about 0.25 to about 5:1, and more preferably, from about 0.5:1 to about 3:1. Preferably, the ratio of the volumetric flow of $Cl_2$ to the combined volumetric flow of $O_2$ and $N_2$ is from about 5:1 to about 20:1, and more preferably from about 7:1 to about 15:1.

For the size of the process chamber described herein, the flow rate of $Cl_2$ is preferably from about 20 to about 800 sccm; the flow rate of $N_2$ is from about 4 to about 60 sccm; and the flow rate of $O_2$ is from about 0.1 to about 40 sccm. Preferably, the flow rate of $N_2$ is maintained within about 20 sccm of the flow rate of $O_2$; and more preferably, the flow rate of $O_2$ and the flow rate of $N_2$, both range from about 1 to about 50 sccm. It should be understood that flow rates are dependent upon the size of the process chamber, and equivalent flow rates for different sized chambers are encompassed within the scope of the present invention.

The power ratio $P_r$ of the first current power level (to inductor coil 75) to the second voltage power level (to the process electrodes 60, 65), is also selected to enhance the ability of the etchant plasma to anisotropically etch the metal silicide layer 22 with high selectivity relative to the polysilicon layer 24. A high power ratio $P_r$ obtained by increasing the first power level of the current applied to the inductor coil 75, increases the amount of dissociated etchant species to provide faster and more isotropic etching. Conversely, a low power ratio $P_r$ obtained from a low first power level to the coil, can cause insufficient dissociation of the etchant gas into dissociated ions resulting in low etch rates and low etching selectivity. Increasing the second power level of the RF voltage applied to the process electrodes 60, 65 increases the degree of anisotropic etching of the metal silicide layer 22 by providing a higher kinetic bombardment energy component to the plasma. However, an excessively high second power level (that also provides a low power ratio $P_r$) can cause sputtering of the substrate 20 and result in non-uniform etching of the substrate. It has been discovered that a preferred power ratio $P_r$ is at least about 0.1:1, and more preferably from about 0.1:1 to about 100:1. Most preferably, the plasma is formed by applying a current at a first power level of about 200 to 2000 Watts to the inductor coil 75 adjacent to the plasma zone 55; and the plasma is attracted to the substrate 20 by applying a voltage at a power level of about 5 to 500 Watts to process electrodes 60, 65 in the plasma zone.

The following examples illustrate use of the present invention for etching metal silicide layers on semiconductor substrate. However, the apparatus and method can be used in other applications as would be apparent to those skilled in the art, and the scope of the present invention should not be limited to the illustrative examples provided herein.

In these examples, the etching processes were performed on silicon substrate having a diameter of 200 mm (8 inches). Each substrate comprised (i) a top 4000 Å thick layer of $WSi_x$, (ii) a middle 4000 Å thick layer of polysilicon, and (iii) a lower 1000 Å $SiO_2$ layer deposited on the monocrystalline silicon substrate. The $WSi_x$ layer on the substrate comprised either of two different Si:W ratios of about 2.1:1 or about 2.96:1, and comprised either a doped polysilicon layer or an undoped polysilicon layer. The different Si:W ratios were used to determine the variation of etching rates for $WSi_x$ layers having different Si:W ratios. The substrate were etched in a "DPS" process chamber having the configuration described above, and the support 52 in the chamber was maintained at a temperature of 50° C.

SEM photos of the etched wafers were used to measure (i) the metal silicide or polysilicon etch rate, (ii) the etching selectivity ratio of etching metal silicide relative to polysilicon, and (iii) the sidewall 48 profile angle. Etch rates were calculated by measuring the step height or depth of the etched features 40 observed in the SEM photographs. The etching selectivity ratio was calculated from the ratio of the etch rate of the metal silicide layers to the etch rate of the polysilicon layer 24.

Examples 1 and 2 demonstrate an etching process of the present invention that used a process gas comprising 130 sccm $Cl_2$, 5 sccm $O_2$, and 18 sccm $N_2$, and the pressure in the chamber was maintained at 4 mTorr. The plasma was formed by applying a RF current at a first power level of 1400 Watts to the inductor coil; and the process electrodes were biased using a RF voltage at a second power level of 100 Watts. In Example 1, the $WSi_x$ layer on the substrate comprised an Si:W ratio of about 2.1:1. In Example 2, the $WSi_x$ layer on the substrate comprised an Si:W ratio of about 2.98:1.

Figure 6:
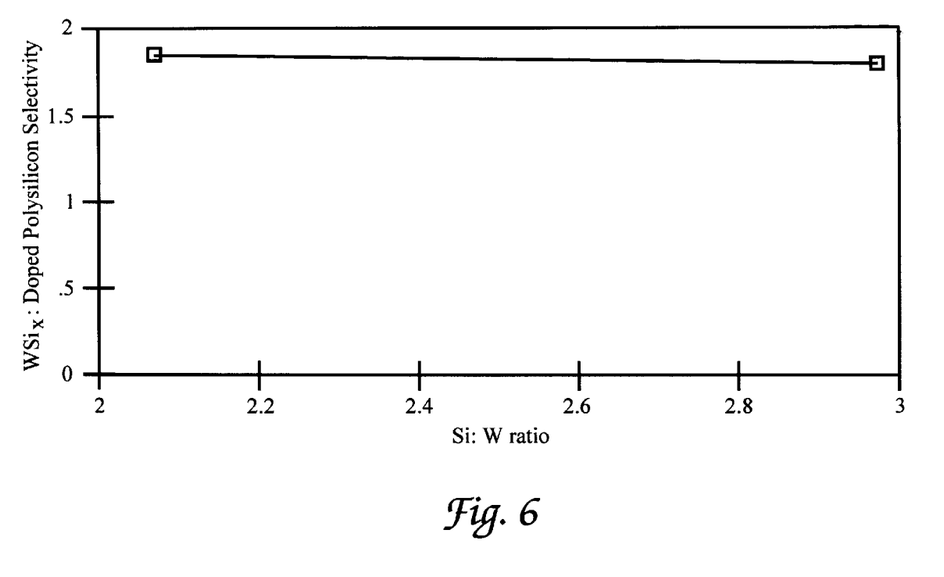
FIG. 6 is a graph showing the etching selectivity of etching $WSi_x$ relative to doped polysilicon for increasing Si:W ratio in the $WSi_x$ film.
Figure 7:
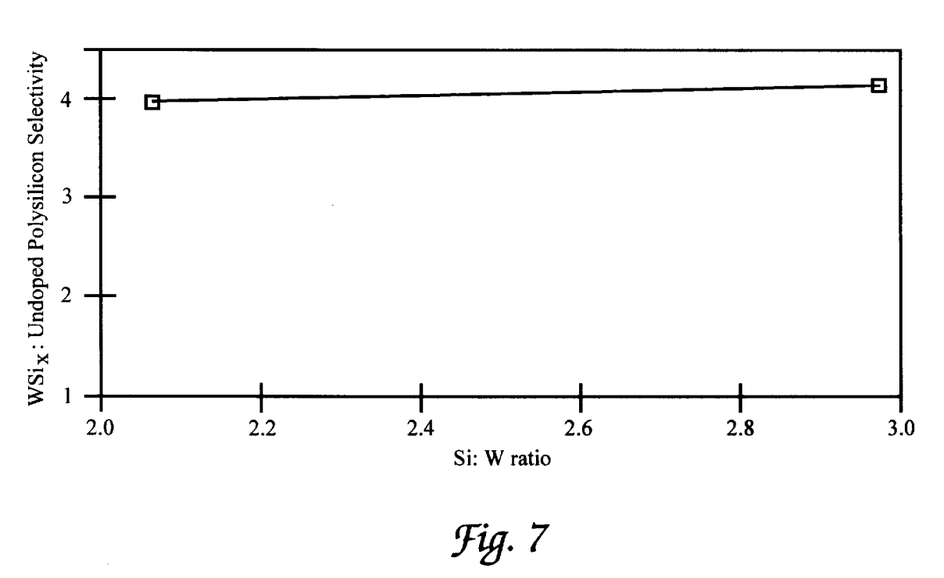
FIG. 7 is a graph showing the etching selectivity of etching $WSi_x$ relative to undoped polysilicon for increasing Si:W ratio in the $WSi_x$ film.

FIG. 6 shows the etching selectivity ratio for etching $WSi_x$ films relative to doped polysilicon for the increasing Si:W ratio of the $WSi_x$ films of Examples 1 and 2. It is observed that the $Cl_2/O_2/N_2$ process gas provide relatively uniform etching selectivity ratios of about 1.8 over the entire range of Si:W stoichiometric ratios. FIG. 7 shows the etching selectivity ratio for etching $WSi_x$ films relative to undoped polysilicon for increasing Si:W ratio in the $WSi_x$ film, for Examples 1 and 2. It is observed that the $Cl_2/O_2/N_2$ process gas provide relatively uniform etching selectivity ratios ranging from about 4 to 5, for the entire range of Si:W stoichiometric ratios. The uniformity of the etching selectivity ratios over a wide range of Si:W ratios in both the doped and undoped polysilicon provides process reproducibility for etching $WSi_x$ layers having varying Si:W ratios.

Although the present invention has been described in considerable detail with regard to the preferred version thereof, other versions are possible. Therefore, the appended claims should not be limited to the description of the preferred versions contained herein.

What is claimed is:

1. A method for etching a substrate comprising metal silicide and polysilicon layers, the method comprising the steps of:
   (a) placing the substrate in a plasma zone;
   (b) introducing into the plasma zone, a process gas comprising $Cl_2$, $O_2$ and $N_2$ and forming a plasma from the process gas, wherein the volumetric flow ratio of $Cl_2$, $O_2$, and $N_2$ is selected to etch the metal silicide layer at a first etch rate that is at least 1.2 times higher than a second rate of etching of the polysilicon layer, while providing substantially anisotropic etching of the metal silicide and polysilicon layers.

2. The method of claim 1, wherein the volumetric flow ratio of $Cl_2$, $O_2$, and $N_2$ is selected to etch the metal silicide and polysilicon layers to form etched features that have sidewalls that form angles of at least about 88° with a surface of the substrate.

3. The method of claim 1, wherein the volumetric flow ratio of $O_2:N_2$ is from about 0.25:1 to about 5:1.

4. The method of claim 3, wherein the volumetric flow ratio of $O_2:N_2$ is from about 0.5:1 to about 3:1.

5. The method of claim 1, wherein the ratio of the volumetric flow of $Cl_2$ to the combined volumetric flow of $O_2$ and $N_2$ is from about 5:1 to about 20:1.

6. The method of claim 5, wherein the ratio of the volumetric flow of $Cl_2$ to the combined volumetric flow of $O_2$ and $N_2$ is from about 7:1 to about 15:1.

7. The method of claim 1, wherein the process gas consists essentially of $Cl_2$, $O_2$, and $N_2$.

8. The method of claim 1, wherein the flow rate of $Cl_2$ is from about 20 to about 800 sccm.

9. The method of claim 1, wherein the flow rate of $N_2$ is from about 4 to about 60 sccm.

10. The method of claim 1, wherein the flow rate of $O_2$ is from about 0.1 to about 40 sccm.

11. The method of claim 1, wherein in step (b), the plasma is formed by applying a current at a power level of about 200 to 2000 Watts to an inductor coil adjacent to the plasma zone.

12. The method of claim 1, wherein in step (b), the plasma is attracted to the substrate by applying a voltage at a power level of about 5 to 500 Watts to process electrodes in the plasma zone.

13. The method of claim 1, wherein the plasma zone is maintained at a pressure 0.1 to 100 mTorr.

14. A method of etching a substrate comprising metal silicide and polysilicon layers, the method comprising the steps of:
   (a) placing the substrate in a process chamber comprising (i) process electrodes therein, and (ii) an inductor coil adjacent to the process chamber;
   (b) introducing into the process chamber, process gas comprising $Cl_2$, $O_2$, and $N_2$; and
   (c) ionizing the process gas to form plasma ions that energetically impinge on the substrate by (i) applying RF current at a first power level to the inductor coil, and (ii) applying a RF voltage at a second power level to the process electrodes,
   wherein the volumetric ratio of $Cl_2$, $O_2$, and $N_2$, and a power ratio $P_r$ of the first power level to the second power level are selected so that the metal silicide layer is etched at a first etch rate that is at least 1.2 times higher than a second rate of etching of the polysilicon layer, while providing substantially anisotropic etching of the metal silicide and polysilicon layers.

15. The method of claim 14, wherein the volumetric flow ratio of $O_2:N_2$ is from about 0.25:1 to about 5:1.

16. The method of claim 15, wherein the volumetric flow ratio of $O_2:N_2$ is from about 0.5:1 to about 3:1.

17. The method of claim 14, wherein the ratio of the volumetric flow of $Cl_2$ to the combined volumetric flow of $O_2$ and $N_2$ is from about 5:1 to about 20:1.

18. The method of claim 17, wherein the ratio of the volumetric flow of $Cl_2$ to the combined volumetric flow of $O_2$ and $N_2$ is from about 7:1 to about 15:1.

19. The method of claim 14, wherein the power ratio $P_r$ of the first power level to the second power level is from about 0.1:1 to about 100:1.

20. The method of claim 14, wherein the first power level is from about 200 to about 2000 Watts.

21. The method of claim 14, wherein the second power level is about 5 to about 500 Watts.

22. A method of etching a substrate surface comprising metal silicide and polysilicon layers, the method comprising the steps of:
(a) placing the substrate surface facing a plasma zone comprising a ceiling having an apex with a height H of about 100 mm to about 175 mm above the substrate surface, the plasma zone having process electrodes and an inductor coil for energizing a plasma; and
(b) energizing a quasi-remote plasma in the plasma zone by introducing into the plasma zone, a process gas comprising $Cl_2$, $O_2$, and $N_2$, and applying RF current at a first power level to the inductor coil and RF voltage at a second power level to the process electrodes, wherein the volumetric ratio of $Cl_2$, $O_2$, and $N_2$, and the power ratio $P_r$ of the first power level to the second power level are selected to form a quasi-remote plasma for anisotropically etching the metal silicide layer at a first etch rate that is at least 1.2 times higher than a second rate of etching of the polysilicon layer.

23. The method of claim 22 wherein the ratio of the volumetric flow of $Cl_2$ to the combined volumetric flow of $O_2$ and $N_2$ is from about 5:1 to about 20:1.

24. The method of claim 23 wherein the volumetric flow ratio of $O_2:N_2$ is from about 0.25:1 to about 5:1.

25. The method of claim 22 wherein the process gas consists essentially of $Cl_2$, $O_2$, and $N_2$.

26. The method of claim 25 wherein the plasma zone comprises a volume of about 10,000 to about 50,000 $cm^3$, and wherein the flow rate of $Cl_2$ is from about 20 to about 800 sccm, the flow rate of $N_2$ is from about 4 to about 60 sccm, and the flow rate of $O_2$ is from about 0.1 to about 40 sccm.

27. The method of claim 22 wherein the plasma is energized by applying a current at a power level of about 200 to about 2000 Watts to the inductor coil, and applying a voltage at a power level of about 5 Watts to about 500 Watts to the process electrodes.

28. The method of claim 22 wherein the plasma zone comprises a multi-radius dome ceiling and the quasi-remote plasma is formed between the substrate surface and the dome ceiling to provide a uniform distribution of plasma ions across the substrate surface.

* * * * *